United States Patent
Bhatt et al.

(10) Patent No.: US 6,453,549 B1
(45) Date of Patent: Sep. 24, 2002

(54) METHOD OF FILLING PLATED THROUGH HOLES

(75) Inventors: Anilkumar C. Bhatt, Johnson City; David E. Houser, Apalachin, both of NY (US); John A. Welsh, Easley, SC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,278

(22) Filed: Dec. 13, 1999

(51) Int. Cl.[7] .................................................. H05K 3/30
(52) U.S. Cl. ............................ 29/837; 29/840; 29/846
(58) Field of Search ........................... 29/825, 827, 845, 29/852, 837, 846, 830, 826, 840

(56) References Cited

U.S. PATENT DOCUMENTS

| | | | |
|---|---|---|---|
| 3,385,773 A | * 5/1968 | Frantzen | 29/845 |
| 4,562,301 A | * 12/1985 | Kameda | 29/845 |
| 4,906,198 A | 3/1990 | Cosimano et al. | |
| 5,259,110 A | * 11/1993 | Bross et al. | 29/852 |
| 5,290,970 A | 3/1994 | Currie | |
| 5,404,637 A | * 4/1995 | Kawakami | 29/830 |
| 5,479,319 A | 12/1995 | Werther | |
| 5,543,586 A | 8/1996 | Crane, Jr. et al. | |
| 5,548,486 A | 8/1996 | Kman et al. | |
| 5,715,595 A | 2/1998 | Kman et al. | |
| 6,018,866 A | * 2/2000 | Crudo et al. | 29/852 |
| 6,195,883 B1 | * 3/2001 | Bhatt et al. | 29/830 |
| 6,272,745 B1 | * 8/2001 | Kersten et al. | 29/852 |

FOREIGN PATENT DOCUMENTS

| | | | | |
|---|---|---|---|---|
| DE | 248239 | * | 7/1987 | 29/830 |
| JP | 4-10494q | * | 1/1992 | 29/852 |
| JP | 5-315762 | * | 11/1993 | 29/852 |

OTHER PUBLICATIONS

I.B.M. Tech. Dicl. Bull vol. 34, No. 7A Dec. 1991, pp 416–418.*

IBM Disclosure #34488 (RO–892–0123) P.D. Isaacs and B.A. Towne, "Repair of Pad to Ball (or Column) on Solder Ball Column Pad–on–Via Opens". Published in Research Disclosure, Dec. 1992, No. 344 Kenneth Mason Publications Ltd., England.

IBM Disclosure #32604 (AT889–0674) R.A. Foster, "Repair Technique for Area Array Solder Interconnections". Published in Research Disclosure, Jun. 1991, No. 326 Kenneth Mason Publications Ltd., England.

* cited by examiner

Primary Examiner—Carl J. Arbes
(74) Attorney, Agent, or Firm—Salzman & Levy; Lawrence R. Fraley

(57) ABSTRACT

A method for conductively filling a hole or via disposed in an electronic package to provide a structure having a lower coefficient of thermal expansion. After fabricating a through hole or a plated through hole in an electronic package, the hole or via is filled with metal, and the surface of the electronic package is sealed.

12 Claims, 2 Drawing Sheets

METHOD OF FILLING PLATED THROUGH HOLES

FIELD OF THE INVENTION

This invention pertains to electronic packaging and, more particularly, to the fabrication of conductive holes or vias in an electronic package.

BACKGROUND OF THE INVENTION

In the manufacture of electronic packages such as printed circuit cards and boards (PCBs) used to carry integrated circuit chips, the vias or through holes are usually filled with organic materials organic hole fill is desirable for a number of reasons, and is achieved by using a soldermask or dielectric materials.

Recently, however, it has been discovered that conductive hole fill can be more advantageous. Upon completing the fabrication of plated through holes (PTHs) with plating of a desired metal thickness in the barrel, metal (copper) pins, or solid wires of desired thickness and length, are inserted into the PTHs. Where wires are used instead of pins, the wires must be cut.

In one embodiment, the surface of the package can be flash plated, in order to seal the pins/wires. Thereafter, a circuitization step is employed in order to fill the holes with metal.

The metal hole fill is more advantageous than is conductive paste with organic materials. One reason for this advantage is that the metal hole fill provides a lower coefficient of thermal expansion (CTE), closer to that of the substrate metals.

Filling the PTHs with metal alleviates the need for plating the holes. The copper or metal pins act as PTHs. This permits fabricating finer lines, since plated copper is eliminated. The procedure also eliminates post hole fill, and the necessity to remove soldermask-based hole fill materials. In addition, the concern of voiding in the PTH fill area is eliminated. Furthermore, the process itself is more efficient than are conventional processes,due to a reduction of waste and recycling costs associated with desmear, seed, plating, and post fill cleaning.

DISCUSSION OF RELATED ART

In U.S. Pat. No. 4,906,198, issued on Mar. 6, 1990, to Cosimano et al, for CIRCUIT BOARD ASSEMBLY AND CONTACT PIN FOR USE THEREIN, a printed circuit board having contact pins is illustrated. The contact pin provides an interference fit within one of the openings, and extends from the outer surface for electrical connection to external components. By contrast, the present invention seeks to provide a filling and seal for the vias and holes in the electronic package.

In U.S. Pat. No. 5,715,595, issued to Kman et al on Feb. 10, 1998 for METHOD OF FORMING A PINNED MODULE, an assembly having electrical pin connectors is shown. The patent describes a method of forming a pinned module. The pin is fitted into a PTH, and is crimped above the PTH surface. The remainder of the pin is attached to a second conductive PTH in a substrate.

In U.S. Pat. No. 5,543,586, issued to Crane, Jr. et al on Aug. 6, 1996 for APPARATUS HAVING INNER LAYERS SUPPORTING SURFACE-MOUNT COMPONENTS, a pin in a PTH is depicted with a fillet at the top of the pin. The pin is connected to an active device and is designed to support surface mounted components.

In U.S. Pat. No. 5,548,486, issued to Kman et al on Aug. 20, 1996 for PINNED MODULE, a pin is fitted into a PTH and the remainder of the pin is attached to another PTH.

In U.S. Pat. No. 5,479,319, issued to Werther on Dec. 26, 1995 for MULTI-LEVEL ASSEMBLIES FOR INTER-CONNECTING INTEGRATED CIRCUITS, a multi-level assembly is shown. The substrates of the assembly are pinned together through their PTHs.

In U.S. Pat. No. 5,290,970, issued to Currie on Mar. 1, 1994 for MULTILAYER PRINTED CIRCUIT BOARD REWORK METHOD AND REWORK PIN, a multilayered PCB is illustrated. A rework method describes a pin that is pressed into a PTH.

In IBM disclosure nos. 34488 (RO892-0123) and 32604 (AT889-0674), repair/rework techniques are described that use pins disposed within PTHs, with subsequent resoldering.

SUMMARY OF THE INVENTION

In accordance with the present invention, there is provided a method for conductively filling a hole or via disposed upon an electronic package. Upon completing the fabrication of plated through holes (PTHs) of desired metal thickness in the barrel, metal (copper) pins or solid wires of desired thickness and length are inserted into the PTHs. Where wires are used instead of pins, the wires are cut. Using pins, one of the options is to flash plate the surface of the package in order to seal the pins. Thereafter, a circuitization step is employed in order to fill the holes with metal. The metal hole fill is more advantageous than that of conductive paste with organic materials. The metal hole fill provides a lower CTE, closer to that of the substrate metals.

It is an object of this invention to provide an improved method of filling PTHs in electronic packages.

It is another object of the invention to provide a method for conductively filling a hole or via of an electronic package by insertion of a pin or wire therein.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

Generally speaking, the invention features a method for conductively filling a hole or via disposed in an electronic package. The electronic package can be a double-sided PCB or a multilayer PCB.

Figure 1:
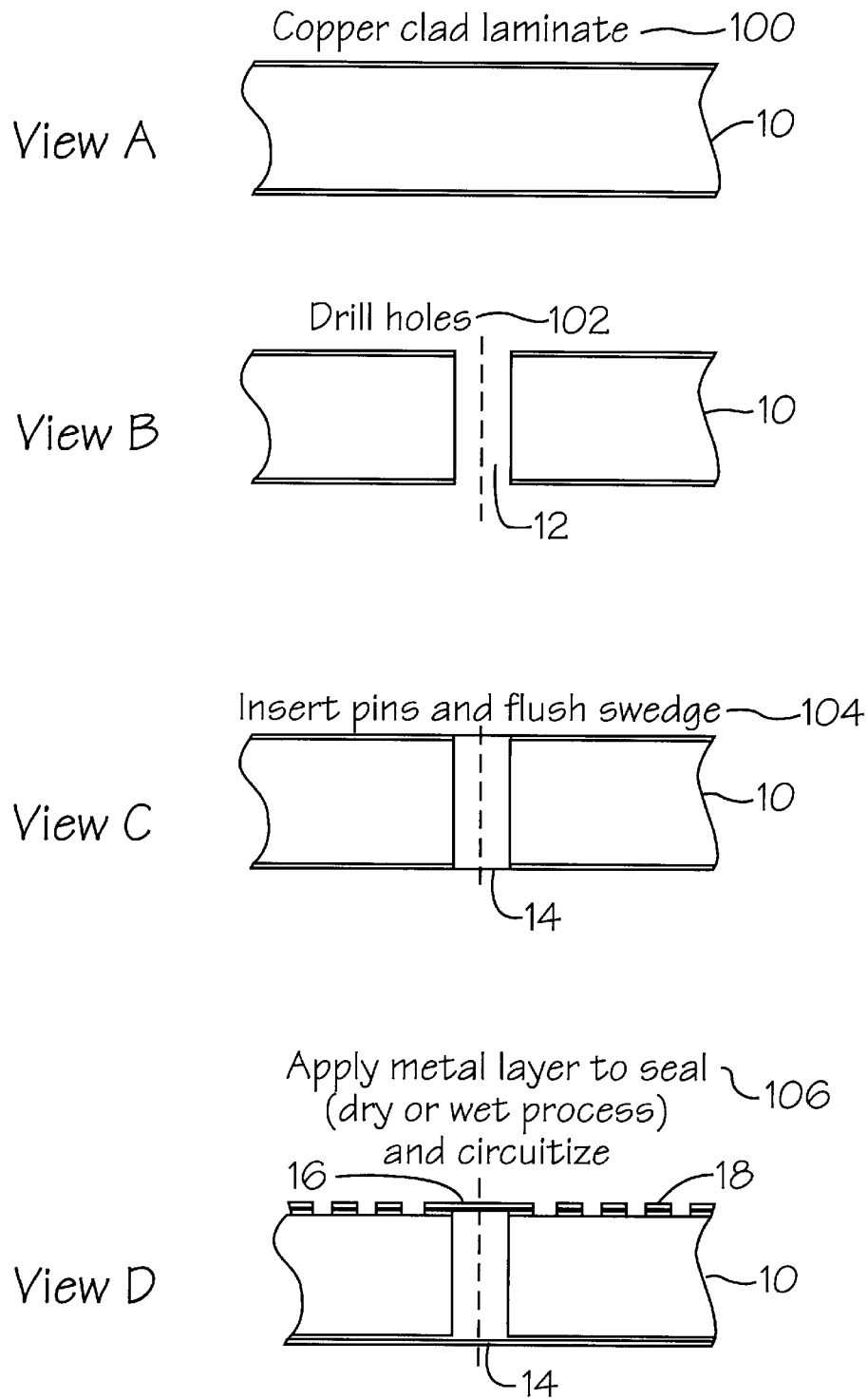
FIG. 1, including Views A–D, is a schematic diagram of the steps of the process flow for making a conductive hole fill structure in a double-sided PCB, in accordance with the invention.

Referring now to FIG. 1, there is shown a schematic diagram of the steps of a process for making a conductive hole fill structure, in accordance with the present invention, for a double-sided PCB. A copper clad laminate 10 is provided, step 100 (View A), and holes 12 are drilled or formed therein, step 102 (View B). Metal (copper) pins 14 or solid wires of desired thickness and length are inserted into the holes 12, step 104 (View C). Using wires instead of pins 14 requires that the wires be cut. The laminate 10 is then swedged, step 104 (View C).

A layer of metal 16 is then applied to the laminate 10 via a wet or dry process, as is well known in the art, step 106 (View D), and the upper and lower surfaces of the laminate 10 are then selectively circuitized 18, step 106 (View D). Using pins 14, one of the options is to flash plate the surface(s) of the package in order to seal the pins 14.

Figure 2:
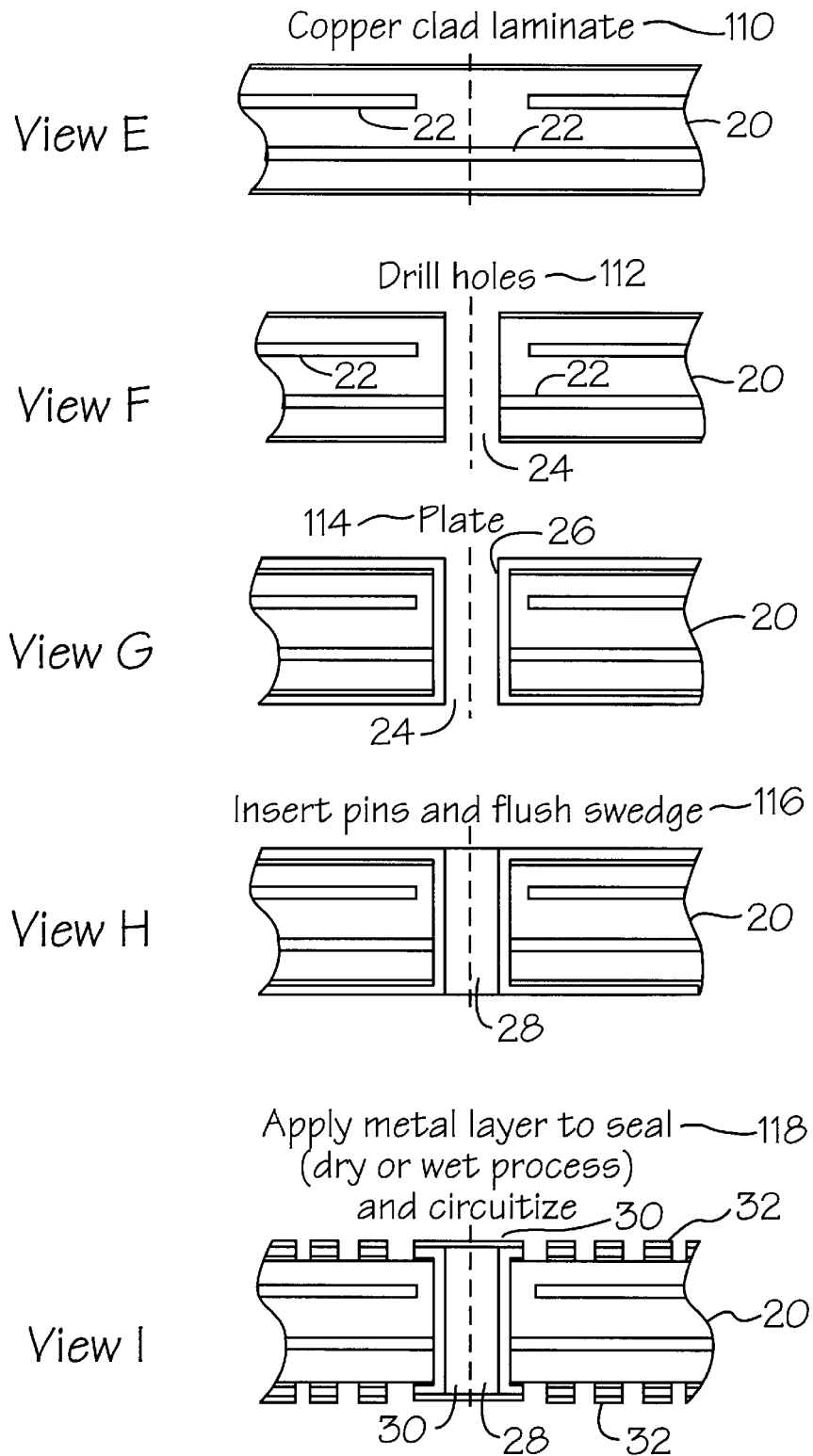
FIG. 2, including Views E–I, is a schematic diagram of the steps of the process flow for making a conductive hole fill structure in a multilayer PCB.

Referring now also to FIG. 2, there is shown a schematic diagram of the steps of a process for making a conductive hole fill structure, in accordance with the present invention, for a multilayer PCB. As with the process for a double-sided PCB discussed hereinabove, a copper clad laminate 20 is provided, step 110 (View E), having at least two layers of conductive material 22, used for signals, power and/or ground. Holes 24 are drilled or formed through the laminate 20, step 112 (View F). The walls 26 of the holes 24 are plated, step 114 (View G), forming PTHs so as to electrically connect layers 22 to each other. Metal (copper) pins 28 or solid wires of desired thickness and length are inserted into the PTHs 24, step 116 (View H). Using wires instead of pins 28 requires that the wires be cut. The laminate 20 is then swedged, step 116 (View H).

A layer of metal 30 is then applied to the laminate 20 via a wet or dry process, as is well known in the art, step 118 (View I), and the upper and lower surfaces of the laminate 20 are then selectively circuitized 32, step 118 (View I). Again, using pins 28, the surface(s) of the package can be flash plated in order to seal the pins 28.

The metal hole fill is more advantageous than that of conductive paste with organic materials. The metal hole fill provides a lower coefficient of thermal expansion, closer to that of the substrate metals.

Filling the PTHs with metal alleviates the need for the holes. The copper or metal pins act as PTHs. This permits fabricating finer lines, since plated copper is eliminated. The procedure also eliminates post hole fill, and the necessity to remove soldermask-based hole fill materials. In addition, the concern of voiding in the PTH fill area is eliminated. Furthermore, the process is more efficient than are conventional processes, due to the reduction of waste and recycling costs associated with desmear, seed, plating, and post fill cleaning.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of filling plated through holes disposed in electronic packages to provide a lower coefficient of thermal expansion for the plated through holes, comprising the steps of:

fabricating plated through holes in said electronic package;

conductively filling said plated through holes with metal; and sealing a surface of said electronic package.

2. The method of filling plated through holes in accordance with claim 1, wherein said plated through holes are filled with metal pins.

3. The method of filling plated through holes in accordance with claim 1, wherein said plated through holes are filled with metal wires.

4. The method of filling plated through holes in accordance with claim 3, further comprising the step of:

cutting said metal wires prior to said sealing step.

5. The method of filling plated through holes in accordance with claim 2, wherein said metal pins comprise copper.

6. The method of filling plated through holes in accordance with claim 1, wherein said sealing step comprises a circuitization step.

7. A method of filling through holes disposed in electronic packages to provide a lower coefficient of thermal expansion for the through holes, comprising the steps of:

fabricating through holes in said electronic package;

conductively filling said through holes with metal; and sealing a surface of said electronic package.

8. The method of filling through holes in accordance with claim 7, wherein said through holes are filled with metal pins.

9. The method of filling through holes in accordance with claim 7, wherein said through holes are filled with metal wires.

10. The method of filling through holes in accordance with claim 9, further comprising the step of:

cutting said metal wires prior to said sealing step.

11. The method of filling through holes in accordance with claim 8, wherein said metal pins comprise copper.

12. The method of filling through holes in accordance with claim 7, wherein said sealing step comprises a circuitization step.

* * * * *